(12) United States Patent
Kim (10) Patent No.: US 7,317,206 B2
(45) Date of Patent: Jan. 8, 2008

(54) CONDUCTIVE ELEMENTS FOR THIN FILM TRANSISTORS USED IN A FLAT PANEL DISPLAY

(75) Inventor: Tae-Sung Kim, Incheon (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/766,564

(22) Filed: Jan. 29, 2004

(65) Prior Publication Data

US 2005/0072973 A1    Apr. 7, 2005

(30) Foreign Application Priority Data

Mar. 12, 2003 (KR) .................. 10-2003-0015356
Sep. 15, 2003 (KR) .................. 10-2003-0063583

(51) Int. Cl.
*H01L 29/04* (2006.01)
*G02F 1/136* (2006.01)

(52) U.S. Cl. .................. 257/59; 257/72; 257/E27.111; 257/E29.151; 369/43

(58) Field of Classification Search .............. 257/72, 257/73, 70, 71, 75, 57, 58, 59, 60, 61
See application file for complete search history.

(56) References Cited

U.S. PATENT DOCUMENTS

| | | | |
|---|---|---|---|
| 4,153,529 A | 5/1979 | Little et al. | |
| 4,511,756 A | 4/1985 | Moeller et al. | |
| 4,646,424 A | 3/1987 | Parks et al. | |
| 4,778,258 A | 10/1988 | Parks et al. | |
| 4,782,380 A | 11/1988 | Shankar et al. | |
| 4,910,580 A | 3/1990 | Kuecher et al. | |
| 4,933,296 A | 6/1990 | Parks et al. | |
| 4,976,839 A | 12/1990 | Inoue | |
| 5,243,202 A | 9/1993 | Mori et al. | |
| 5,278,099 A | 1/1994 | Maeda | |
| 5,341,026 A | 8/1994 | Harada et al. | |
| 5,345,108 A | 9/1994 | Kikkawa | |
| 5,485,019 A | 1/1996 | Yamazaki et al. | |
| 5,555,112 A | 9/1996 | Oritsuki et al. | |

(Continued)

FOREIGN PATENT DOCUMENTS

EP    1 011 463    5/2000

(Continued)

OTHER PUBLICATIONS

An article "Relationship between copper concentration and stress during electromigration in an Al(0.25 at. % Cu) conductor line" written by Kao, et al. published in Journal of Applied Physics, vol. 93, No. 5, pp. 2516-2527, on Mar. 1, 2003.

(Continued)

*Primary Examiner*—Fazli Erdem
(74) *Attorney, Agent, or Firm*—Robert E. Bushnell, Esq.

(57) ABSTRACT

Provided is a structure for conductive members in a TFT display. The structure is aluminum based and is heat treated. When heat treated, no hillocks are formed because of the presence of a titanium layer. Furthermore, $TiAl_3$ is not formed because of the presence of a TiN diffusion layer between the aluminum and the Ti layers. This novel structure has a low resistivity and is therefore suited for large displays that use thin film transistors to drive the pixels.

7 Claims, 8 Drawing Sheets

U.S. PATENT DOCUMENTS

| | | | |
|---|---|---|---|
| 5,607,776 A | 3/1997 | Mueller et al. | |
| 5,742,468 A | 4/1998 | Matsumoto et al. | |
| 5,747,879 A | 5/1998 | Rastogi et al. | |
| 5,759,916 A | 6/1998 | Hsu et al. | |
| 5,804,878 A * | 9/1998 | Miyazaki et al. | 257/764 |
| 5,893,752 A | 4/1999 | Zhang et al. | |
| 6,028,003 A | 2/2000 | Frisa et al. | |
| 6,096,572 A | 8/2000 | Nakamura | |
| 6,147,375 A | 11/2000 | Yamazaki et al. | |
| 6,147,403 A | 11/2000 | Matschitsch et al. | |
| 6,160,272 A * | 12/2000 | Arai et al. | 257/72 |
| 6,166,396 A | 12/2000 | Yamazaki | |
| 6,180,511 B1 | 1/2001 | Kim et al. | |
| 6,224,942 B1 | 5/2001 | Leiphart | |
| 6,255,706 B1 | 7/2001 | Watanabe et al. | |
| 6,271,543 B1 | 8/2001 | Ohtani et al. | |
| 6,285,123 B1 | 9/2001 | Yamada et al. | |
| 6,309,965 B1 | 10/2001 | Matschitsch et al. | |
| 6,348,735 B1 | 2/2002 | Yamaoka et al. | |
| 6,365,927 B1 | 4/2002 | Cuchiaro et al. | |
| 6,380,625 B2 | 4/2002 | Pramanick et al. | |
| 6,410,986 B1 | 6/2002 | Merchant et al. | |
| 6,414,738 B1 * | 7/2002 | Fujikawa | 349/147 |
| 6,440,752 B1 | 8/2002 | Zhang et al. | |
| 6,448,612 B1 | 9/2002 | Miyazaki et al. | |
| 6,518,630 B2 | 2/2003 | You et al. | |
| 6,534,393 B1 | 3/2003 | Zhou et al. | |
| 6,608,353 B2 | 8/2003 | Miyazaki et al. | |
| 6,642,093 B2 | 11/2003 | Kubo et al. | |
| 6,650,017 B1 | 11/2003 | Akamatsu et al. | |
| 6,674,502 B1 | 1/2004 | Terakado et al. | |
| 2001/0043175 A1 | 11/2001 | Yasukawa | |
| 2001/0052954 A1 * | 12/2001 | Ohori et al. | 349/44 |
| 2002/0076574 A1 | 6/2002 | Cabral, Jr. et al. | |
| 2002/0085157 A1 | 7/2002 | Tanaka et al. | |
| 2002/0142605 A1 | 10/2002 | Kim | |
| 2003/0222575 A1 | 12/2003 | Yamazaki | |
| 2004/0183072 A1 * | 9/2004 | Kim et al. | 257/59 |

FOREIGN PATENT DOCUMENTS

| | | | |
|---|---|---|---|
| JP | 59-232464 | | 12/1984 |
| JP | 62-120076 | | 6/1987 |
| JP | 62-221159 | | 9/1987 |
| JP | 64-19763 | | 1/1989 |
| JP | 64-36083 | | 2/1989 |
| JP | 04-265757 | | 9/1992 |
| JP | 06-216263 | | 8/1994 |
| JP | 07-58110 | | 3/1995 |
| JP | 07-120789 | | 5/1995 |
| JP | 08-129292 | | 5/1996 |
| JP | 09-45927 | | 2/1997 |
| JP | 09-153623 | | 6/1997 |
| JP | 09-213656 | | 8/1997 |
| JP | 11-144709 | | 5/1999 |
| JP | 2000-081632 | | 3/2000 |
| JP | 2000-149766 | | 5/2000 |
| JP | 2000-195948 | | 7/2000 |
| JP | 2002-26335 | * | 1/2002 |
| JP | 2002-328389 | | 11/2002 |
| JP | 2003-031588 | | 1/2003 |
| WO | WO 99/08322 | | 2/1999 |

OTHER PUBLICATIONS

An article The microsctructure of submicrometer wide planar-reactive ion etched versus trench-demascene AlCu lines: written by Rodbell, et al., published in Journal of Applied Physics, vol. 88, No. 9, pp. 5093-5099, on Nov. 1, 2000.

An article "Stress Induced Metallurgical Effects in TI/TiN/AlCu/TiN Metal Stacks" written by Koller, et al., published in Stress Induced Phenomena in Metallization, vol. 612, pp. 235-246, on Apr. 2002.

Japanese Office Action corresponding to Patent Application No. 2004-008469, issued on May 29, 2007.

* cited by examiner

CONDUCTIVE ELEMENTS FOR THIN FILM TRANSISTORS USED IN A FLAT PANEL DISPLAY

CLAIM OF PRIORITY

This application makes reference to, incorporates the same herein, and claims all benefits accruing under 35 U.S.C. §119 from an application for THIN FILM TRANSISTOR AND FLAT PANEL DISPLAY COMPRISING THE SAME earlier filed in the Korean Intellectual Property Office on 12 Mar. 2003 and thereby duly assigned Serial No. 2003-15356, and filed on 15 Sep. 2003 and assigned Serial No. 2003-63583.

BACKGROUND OF THE INVENTION

1. Field of the Invention

The present invention relates to thin film transistors in a flat panel display. More particularly, the present invention relates to a novel structure for the electrodes and conductive lines found in thin film transistor structures that have small resistance loss and prevent image quality degradation caused by resistance loss in a large flat panel display.

2. Description of the Related Art

A thin film transistor (hereinafter, referred to as TFT) is a device of where a source electrode and a drain electrode can be electrically connected through a channel formed in a semiconductor layer that physically connects the source and drain electrodes according to a voltage applied to a gate electrode. The TFT is mainly used in a TFT panel of an active matrix flat panel display such as an electroluminescent display and a liquid crystal display. The TFT serves to independently drive sub-pixels that make up the display.

A source electrode and a gate electrode of a TFT formed in a flat panel display are connected to driving circuits arranged on sides of the flat panel display through conductive lines. Generally, a source electrode, a drain electrode, and conductive lines electrically connected to the source and drain electrodes are often formed together and have the same structure using the same material for the sake of simplifying a manufacture process.

A source electrode, a drain electrode, and conductive lines electrically connected thereto may be made of a chromium (Cr) based metal or a molybdenum (Mo) based metal such as Mo and MoW. However, since these metals have a relatively high resistance, in a case where a TFT panel has a large size or its sub-pixels have small sizes, a voltage drop between driving circuits and the sub-pixels may increase. This causes a response speed of the sub-pixels to decrease or to result in a non-uniform distribution of an image. These problems of speed and non-uniformity of image are further aggravated by the fact that newer displays are large, and the conductive lines that electrically connect to the pixels in aq large display are very long. These long conductive lines found in large displays magnify the resistive losses in a conductive line. Therefore, in recent years, with the advent of large TFT displays, it is even more important to use materials with low resistive losses to electrically connect to tach TFT in a display.

In addition to the fact that newer displays are large, the speed and non-uniformity problem are further aggravated by the fact that these conductive lines generally undergo a heat treatment process subsequent to formation of these conductive lines and electrodes. For example, the activation process after gate metal sputtering is necessary in TFT fabrication, and the temperature of annealing is generally needed to be higher than 400° C. In this case, the high temperature annealing may cause connection lines and electrodes to form at a high resistance, especially when incorporated in a large display panel.

In order to solve the above problems, aluminum (Al) has been used in conductive lines and electrode structures for TFT's. Aluminum may have a low resistance as a material for a gate electrode and a conductive line connecting the gate electrode to a driving circuit. Aluminum may also drop the resistance in source electrodes, drain electrodes, and conductive lines electrically connected to the source and drain electrodes. Hereinafter, the source electrode, the drain electrode, the gate electrode and the conductive lines electrically connected to the source, drain and gate electrodes will be referred to as "TFT conductive elements."

U.S. patent application Laid-Open Publication No. 2002/0085157 to Tanaka et al (hereinafter Tanaka '157) discloses TFT conductive elements made of Al. Each of the TFT conductive elements has a stacked structure of titanium nitride (TiN) layer/Al layer, TiN layer/Ti layer/Al layer, or TiN layer/Al layer/Ti layer, as illustrated in FIG. 7 of Tanaka '157. Advantages of such a structure include reduction of an electrical connection resistance (or contact resistance) between the TFT conductive elements and terminals connected to the TFT conductive elements as well as suppression of the generation of Al hillocks (or small hills or mounds) generated by a heat treatment process subsequent to the formation of the TFT conductive elements. However, Tanaka '157 fails to disclose solutions to reduce the resistance of the TFT conductive elements. Tanaka '157 fails to address prevention of the formation of highly resistive $TiAl_3$ when heat treated. $TiAl_3$ in the conductive layers causes the resistance of the conductive lines to increase, especially for large displays.

What is therefore needed is a structure for conductive lines as well as structures for electrodes in TFT's for a large display that have a low resistance, even after a heat treatment, the conductive lines and electrodes do not have $TiAl_3$ present and have no hillocks even after heat treatment.

SUMMARY OF THE INVENTION

It is therefore an object of the present invention to provide a novel structure for a conductive elements used in a TFT in a flat panel display that has a low resistivity, even after a heat treatment.

It is further an object of the present invention to provide a novel structure for conductive layer for conductive elements in a TFT in a display that is made using aluminum and does not have any hillocks and does not have any $TiAl_3$, even after a heat treatment.

It is also an object of the present invention to provide a novel structure for conductive lines and electrodes used in TFT displays that improves display uniformity and improves speed, especially when the display is very large.

These and other objects may be achieved by a TFT having a source electrode, a drain electrode, a gate electrode, and a semiconductor layer, where at least one of the source electrode, the drain electrode, and the gate electrode is made from an aluminum-based metal layer, a titanium layer, and a diffusion prevention layer interposed the aluminum-based layer and the titanium layer.

According to another aspect of the present invention, there is provided a large flat panel display having a large number of sub-pixels driven by TFTs, each of the TFTs having a source electrode, a drain electrode, a gate electrode, and a semiconductor layer, where at least one of the source electrode, the drain electrode, and the gate electrode is made up of an aluminum-based metal layer, a titanium layer, and a diffusion prevention layer interposed between the aluminum-based layer and the titanium layer. The diffusion prevention layer prevents aluminum in the aluminum-based layer from reacting with the titanium in the titanium layer during the heat treatment or annealing process and forming unwanted $TiAl_3$, the presence of which increases the resistance or resistivity of the connection members.

The diffusion prevention layer and the titanium layer may be orderly formed on opposite surfaces of the aluminum-based metal layer, or the diffusion prevention layer and the titanium layer may be formed on any one side of the aluminum-based metal layer. The diffusion prevention layer may be a titanium nitride layer. The titanium nitride layer may contain 5 to 85 wt % of nitrogen. The titanium nitride layer may have a thickness of about 100 to 600 Å, preferably about 100 to 400 Å, more preferably 200 to 400 Å, and most preferably about 300 Å.

The aluminum-based metal layer may be made of an aluminum alloy containing about 0.5 to 5 wt % of one element selected from the group consisting of silicon, copper, neodymium, platinum, and nickel. The aluminum-based metal layer may be made of an aluminum-silicon alloy containing about 2 wt % of silicon.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
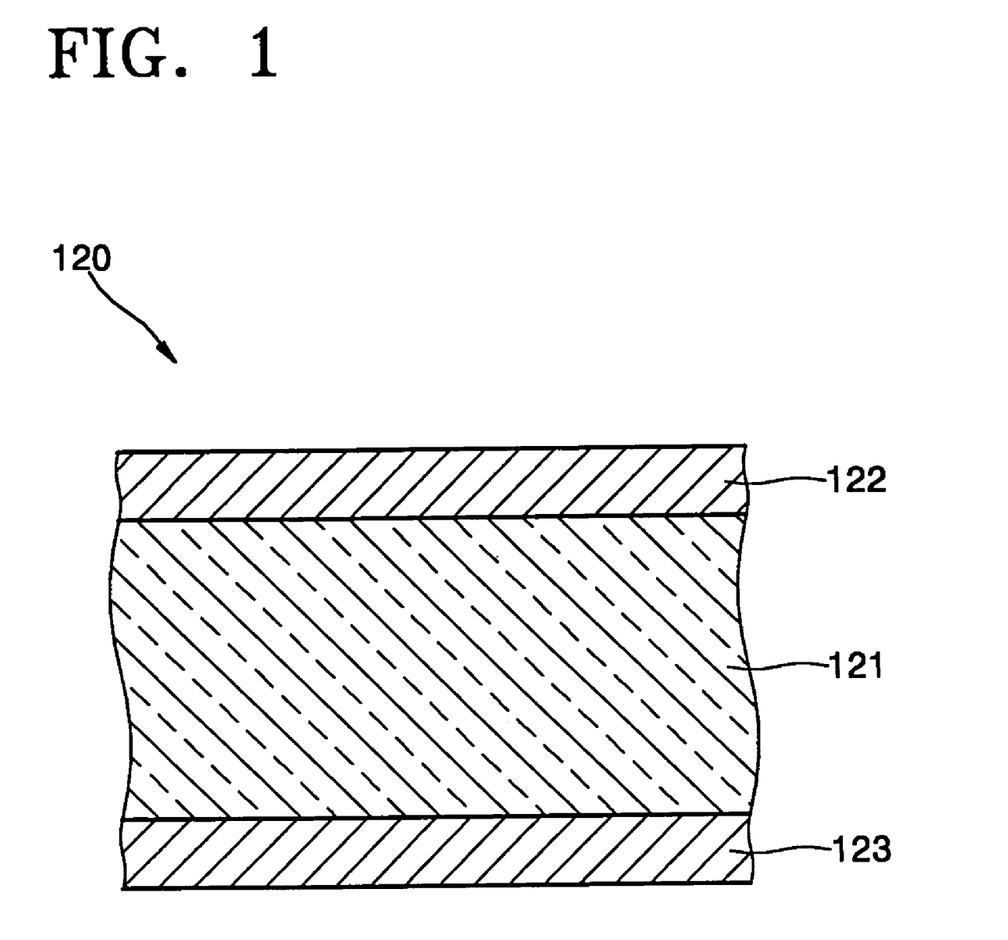
FIG. 1 is a sectional view of a TFT conductive element.

Turning now to the figures, FIG. 1 illustrates a TFT conductive element 120 having a stacked structure of a Ti layer 122, an Al layer 121, and a Ti layer 123. The Ti layers prevent the generation of Al hillocks formed during a heat treatment process. However, $TiAl_3$ may be generated at an interface between the Al layer and the Ti layer during a heat treatment process. The $TiAl_3$ increases the resistance of the TFT conductive element.

Figure 2:
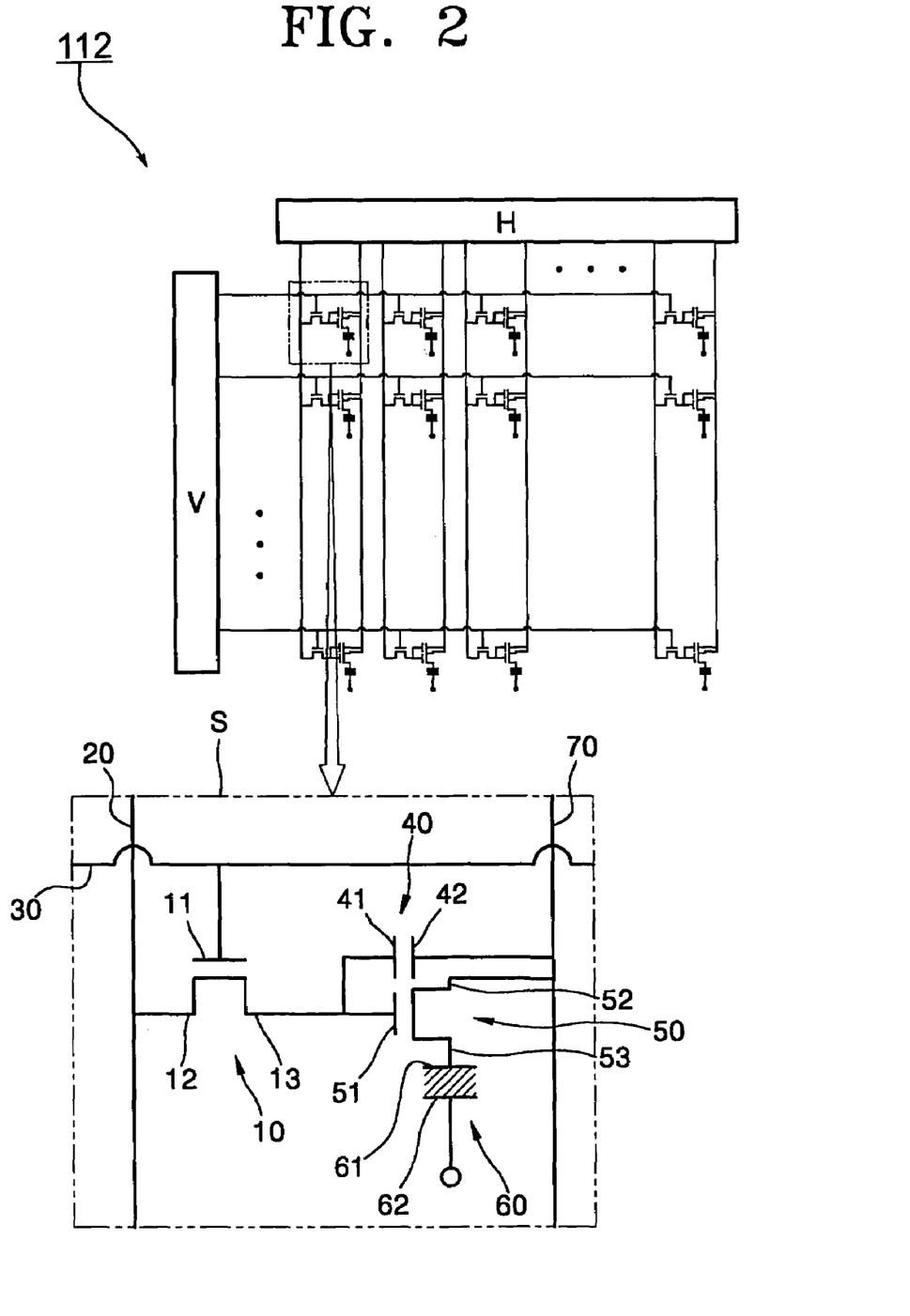
FIG. 2 is a circuit view of a flat panel display having an array of TFTs.

FIG. 2 illustrates a circuit 112 of a flat panel display made up many sub-pixels, each sub-pixel having two TFT's. The circuit 112 includes a first TFT 10, a second TFT 50, a storage capacitor 40, and a light emission unit 60. A first source electrode 12 in the first TFT 10 is connected to a horizontal driving circuit H through a first conductive line 20 and a first gate electrode 11 in the first TFT 10 is connected to a vertical driving circuit V through a second conductive line 30. A first drain electrode 13 in the first TFT 10 is connected to a first capacitor electrode 41 of the storage capacitor 40 and to a second gate electrode 51 of the second TFT 50. A second capacitor electrode 42 of the storage capacitor 40 and a second source electrode 52 of the second TFT 50 are connected to a third conductive line 70. A second drain electrode 53 of the second TFT is connected to a first electrode 61 of the light emission unit 60. A second electrode 62 of the light emission unit 60 is arranged opposite to the first electrode 61 and spaced a predetermined gap apart from the first electrode 61. Between second electrode 62 and first electrode 61 is an active layer. The active layer may be an organic material layer, an inorganic material layer, or a liquid crystal layer and is arranged between the first electrode 61 and second electrode 62 according to the types of flat panel displays.

Figure 3:
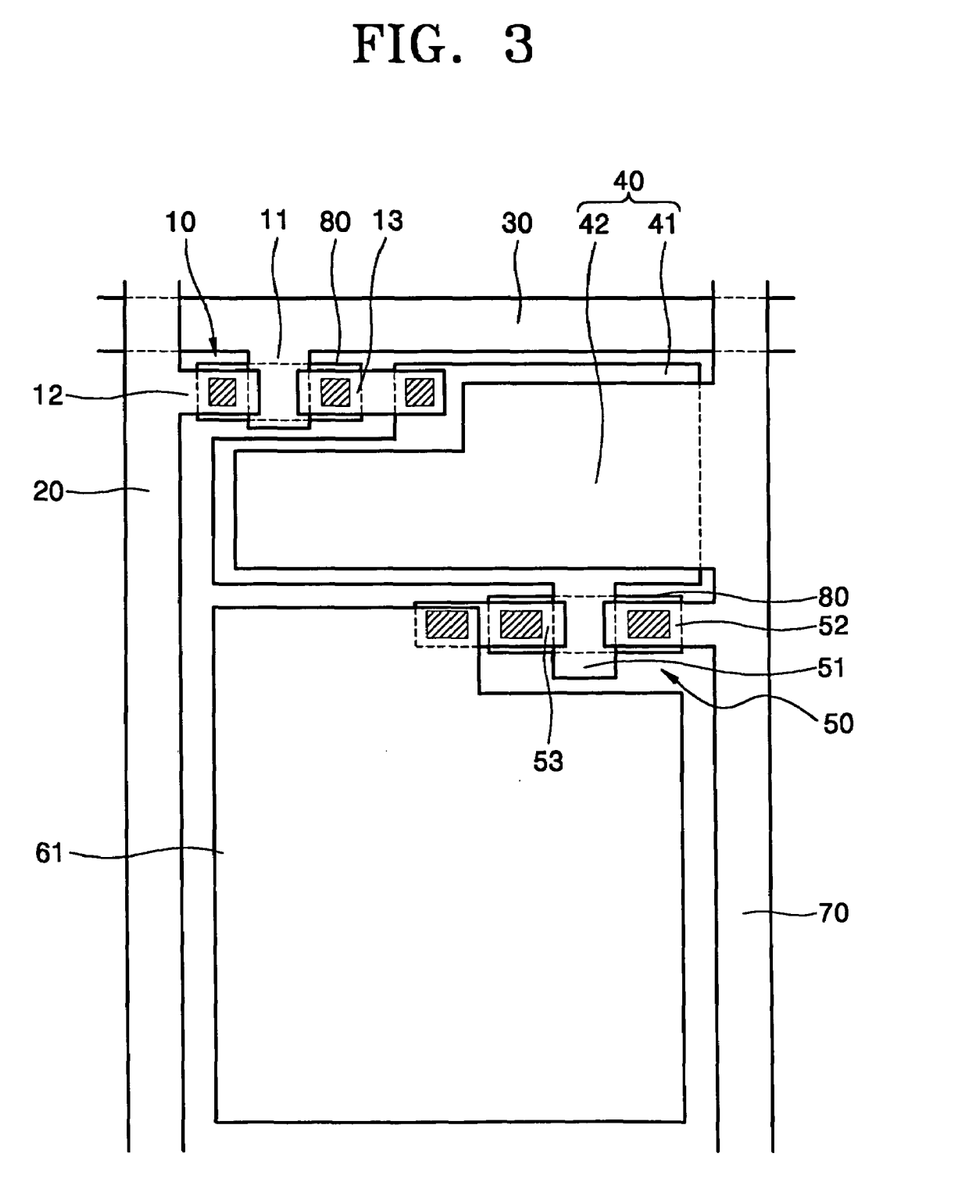
FIG. 3 is a schematic plan view of the physical structure of one sub-pixel corresponding to a part "S" of FIG. 2.

FIG. 3 schematically illustrates a physical structure of one sub-pixel of the flat panel display of FIG. 2. For the sake of simplicity, only conductive constitutional elements are illustrates in FIG. 3. Therefore, nonconductive constitutional elements such as a substrate, a buffer layer, various types of insulating layers, a planarization layer, a light emission layer, a liquid crystal layer, a second electrode, a polarization layer, an orientation layer, and a color filter layer are omitted. These nonconductive constitutional elements are instead illustrated in FIGS. 4 and 5. Only constitutional elements positioned at regions represented by oblique (or slanted) lines in FIG. 3 are electrically connected to each other. Other regions that are not represented by oblique lines are insulated.

When a voltage is applied to the first gate electrode 11, a conductive channel is formed in a semiconductor layer 80 that connects the first source electrode 12 and the first drain electrode 13. At this time, when charge is supplied to the first source electrode 12 through the first conductive line 20, the charge moves into the first drain electrode 13. Charge determining the luminance of a driving unit flows through the third conductive line 70. When the charge of the first drain electrode is supplied to the second gate electrode 51, the charge of the second source electrode 52 moves into the second drain electrode 53, thereby driving the first electrode 61 of the light emission unit 60. The storage capacitor 40 serves to maintain a driving operation of the first electrode 61 or increase a driving speed. For reference, the first TFT 10 and the second TFT 50 have a similar section structure.

Figure 4:
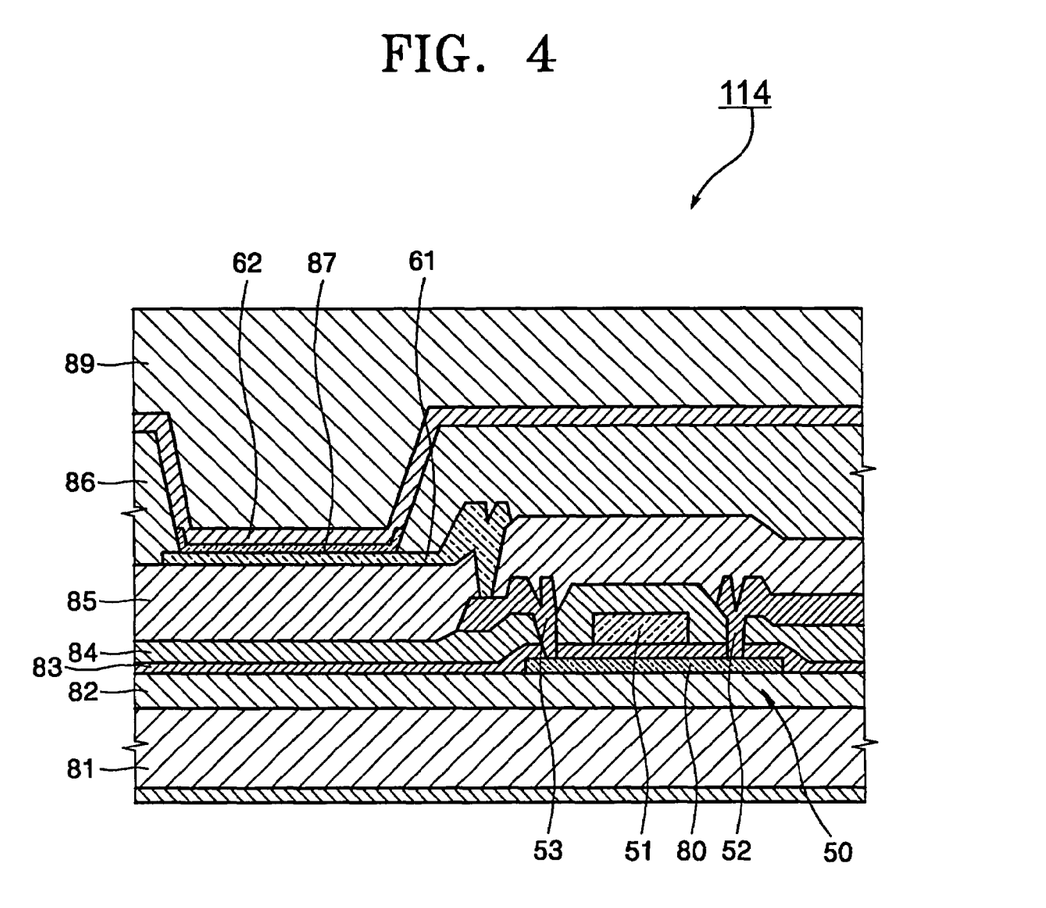
FIG. 4 is a sectional view of one sub-pixel of an electroluminescent display having a TFT.

An electroluminescent display 114 illustrated in FIG. 4 includes a TFT panel, a light emission layer 87, and a second electrode 62. The TFT panel includes a substrate 81, a TFT 50, a first conductive line 20, a second conductive line 30, and a first electrode 61. In the case of a rear emission type electroluminescent display, the substrate 81 may be made of a transparent material, for example glass, and the second electrode 62 may be made of a metal with good reflectivity such as aluminium. On the other hand, in the case of a front emission type electroluminescent display, the second electrode 62 may be made of a transparent conductive material, for example, indium tin oxide (ITO), and the first electrode 61 may be made of a metal with good reflectivity.

A buffer layer 82 is formed on the whole surface of the substrate 81. A semiconductor layer 80 is formed to a predetermined pattern on the buffer layer 82. Semiconductor layer 80 may be made of silicon. A first insulating layer 83 is formed on the semiconductor layer 80 and on the remaining exposed surface of the buffer layer 82 where the semiconductor layer 80 is not formed. A second gate electrode 51 is formed to a predetermined pattern on the first insulating layer 83. A second insulating layer 84 is formed on the second gate electrode 51 and on the remaining exposed surface of the first insulating layer 83 on where the second gate electrode 51 is not formed. After the formation of the second insulating layer 84, the first and second insulating layers 83 and 84 respectively are subjected to etching such as dry etching to expose portions of the semiconductor layer 80. The exposed portions of the semiconductor layer 80 are connected to a second source electrode 52 and a second drain electrode 53, that are formed to a predetermined pattern. After the formation of the second source and drain electrodes 52 and 53 respectively, a third insulating layer 85 is formed thereon. A portion of the third insulating layer 85 is etched to electrically connect the second drain electrode 53 and the first electrode 61. After the formation of the first electrode 61 on the third insulating layer 85, a planarization layer 86 is formed. The portion of the planarization layer 86 corresponding to the first electrode 61 is etched. Then, the light emission layer 87 is formed on the first electrode 61 and the second electrode 62 is formed on the light emission layer 87. In addition, encapsulation layer 89 is formed over second electrode 62.

The TFT 50 includes the second source electrode 52, the second drain electrode 53, the second gate electrode 51, and the semiconductor layer 80. Generally, the second source electrode 52 and the second drain electrode 53 are formed at a predetermined gap from each other on the same horizontal plane. The second source electrode 52 and the second drain electrode 53 are physically connected to the semiconductor layer 80. The second gate electrode 51 is electrically insulated from the second source electrode 52, the second drain electrode 53, and the semiconductor layer 80. The second gate electrode 51 is positioned above the semiconductor layer 80 and between the second source electrode 52 and the second drain electrode 53. Meanwhile, generally, a TFT is divided into a staggered type, an inverted staggered type, a coplanar type, and an inverted coplanar type according to the arrangements of the above electrodes and the semiconductor layer 80. A coplanar type is illustrated in the present invention, but the present invention is not limited thereto.

The TFT 50 of FIG. 4 corresponds to the second TFT 50 illustrated in FIG. 3. In this case, the second source electrode 52 is connected to the third conductive line 70, the second gate electrode 51 is connected to the first drain electrode 13 of the first TFT 10, the second drain electrode 53 is connected to the first electrode 61 of light emitting unit 60, the first source electrode 12 of the first TFT 10 is connected to the first conductive line 20, and the first gate electrode 11 is connected to the second conductive line 30. According to the present invention, the first conductive line 20 corresponds to a data line for transmitting data and the second conductive line 30 corresponds to a scan line.

The structure of an electroluminescent display 114 will now be described in detail with reference to FIG. 4. As illustrated in FIG. 4, an electroluminescent display 114 includes the first electrode 61, the light emission layer 87 formed on the first electrode 61, and the second electrode 62 formed on the light emission layer 87. An electroluminescent display 114 can be divided into organic and inorganic electroluminescent displays. With respect to an organic electroluminescent display, the light emission layer 87 is largely having an electron transport layer, a light emission material layer, and a hole transport layer. With respect to an inorganic electroluminescent display, insulating layers are interposed between the first electrode 61 and the light emission layer 87 and between the second electrode 62 and the light emission layer 87.

The light emission layer 87 of an organic electroluminescent display is made of an organic material, for example, phthalocyanine such as copper phthalocyanine (CuPc), N,N'-di(naphthalene-1-yl)-N,N'-diphenyl benzidine (NPB), or tris-8-hydroxyquinoline aluminium (Alq3). When charge is supplied to the first electrode 61 and the second electrode 62, holes and electrons recombine with each other to generate excitons. When the excitons are changed from an excited state to a ground state, the light emission material layer 87 emits light.

Regarding an inorganic electroluminescent display, an inorganic material layer between the insulating layers positioned at inner sides of the first electrode 61 and second electrode 62 emits light. An inorganic material for the inorganic material layer may be metal sulfide such as ZnS, SrS, and CsS. Recently, alkaline earth-based calcium sulfide such as $CaCa_2S_4$ and $SrCa_2S_4$, and metal oxide are also used. Transition metals such as Mn, Ce, Th, Eu, Tm, Er, Pr, and Pb and alkaline rare earth metals may be used as light emitting core atoms that form the light emission layer 87 together with the above inorganic material. When a voltage is applied to the first electrode 61 and second electrode 62, electrons are accelerated and collide with the light emitting core atoms. At this time, electrons of the light emitting core atoms are excited to a higher energy level and then fall back to a ground state. Accordingly, the inorganic material layer emits light.

Figure 5:
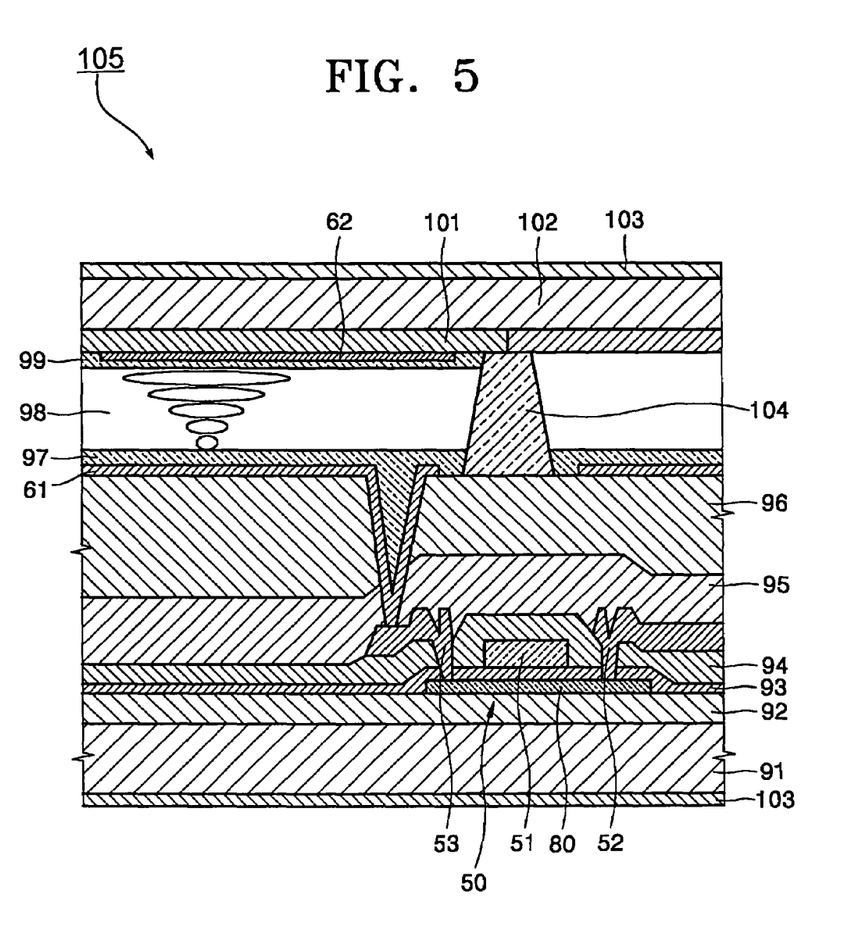
FIG. 5 is a sectional view of one sub-pixel of a liquid crystal display having a TFT.

FIG. 5 illustrates a liquid crystal display 105. A liquid crystal display and an electroluminescent display have a similar TFT panel structure, but different adjoining constitutional elements. Hereinafter, only adjoining constitutional elements of the TFT panel in a liquid crystal display will be described.

A liquid crystal display 105 includes a TFT panel, a first orientation layer 97, a second substrate 102, a second electrode 62, a second orientation layer 99, a liquid crystal layer 98, and a polarization layer 103. The TFT panel includes a first substrate 91, a TFT 50, a first conductive line 20, a second conductive line 30, and a first electrode 61. The first substrate 91 corresponds to the substrate of an electroluminescent display.

The first substrate 91 and the second substrate 102 are separately manufactured. A color filter layer 101 is formed on the lower surface of the second substrate 102. The second electrode 62 is formed on the lower surface of the color filter layer 101. The first orientation layer 97 and the second orientation layer 99 are formed on the upper surface of the first electrode 61 and the lower surface of the second electrode 62, respectively. The first and second orientation layers 97 and 99 lead to a proper orientation of a liquid crystal of the liquid crystal layer 98 interposed therebetween. The polarization layer 103 is formed on each of the outer surfaces of the first and second substrates 91 and 102 respectively. A spacer 104 is used to maintain a gap between the first and second substrates. Reference numbers 92, 93, 94, 95 and 96 in FIG. 5 represent a buffer layer, a first insulating layer, a second insulating layer, a third insulating layer and a planarization layer respectively.

A liquid crystal display allows light to pass through or be blocked according to the arrangement of a liquid crystal. The arrangement of the liquid crystal is determined by an electric potential difference between the first and second electrodes.

Light that has passed through the liquid crystal layer exhibits a color of the color filter layer 101, thereby displaying an image.

According to the present invention, "TFT conductive elements" defined in the Description of the Related Art include the first and second source electrodes 12 and 52, the first and second drain electrodes 13 and 53, the first and second gate electrodes 11 and 51, the first conductive line 20, the second conductive line 30, and the third conductive line 70. Hereinafter, the structures of the TFT conductive elements will be described in detail with reference to FIG. 6.

Figure 6:
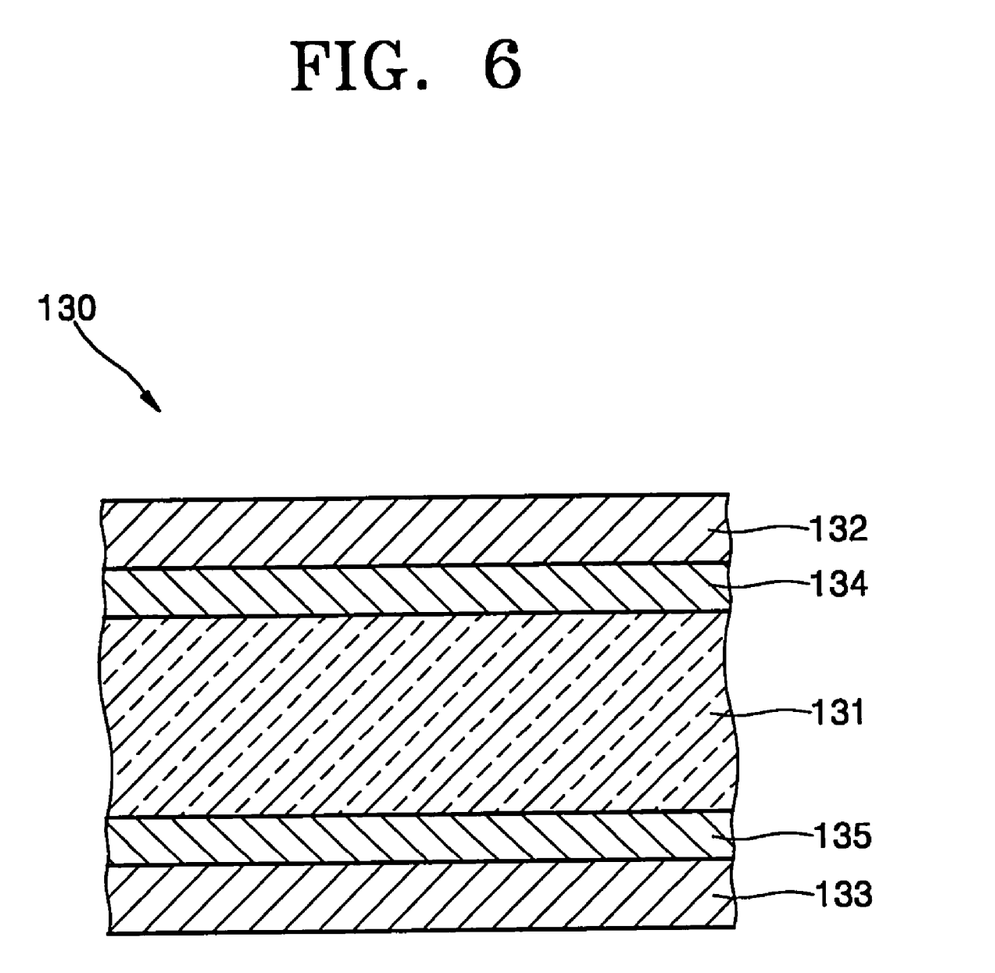
FIG. 6 is a sectional view of a TFT conductive element according to the principles of the present invention.

According to the present invention, the first and second gate electrodes 11 and 53 are formed simultaneously with the second conductive line 30 using the same material. The first and second source electrodes 12 and 52, the first and second drain electrodes 13 and 53, the first conductive line 30, and the third conductive line 70 are at the same time formed using the same material. Since the formation sequences and materials for these TFT conductive elements may vary according to manufacture processes, they are not limited to those as described above.

At least one of TFT conductive elements 130 according to the present invention includes an aluminum (Al)-based metal layer 131 and titanium (Ti) layers 132 and 133. Diffusion prevention layers 134 and 135 are interposed between the Al-based metal layer and the respective Ti layers. Although FIG. 6 illustrates that the diffusion prevention layers and the Ti layers are formed on both surfaces of the Al-based metal layer, a diffusion prevention layer and a Ti-layer may be formed on only one surface of the Al-based metal layer, that is also within the scope of the present invention.

Among the TFT conductive elements, in particular, the second source electrode 52 and the second drain electrode 53 of FIG. 4 are formed in a vertically long shape. For this reason, the layer structures of the second source electrode 52 and the second drain electrode 53 may be distorted. That is, although the second source electrode 52 and the second drain electrode 53 have a diffusion prevention layer and a Ti-layer between the Al-based metal layer 131 and the semiconductor layer 80, due to such distorted layer structure, the Al-based metal layer 131 and the semiconductor layer 80 may be partially in contact with each other. In this case, where the Al-based metal layer 131 is made of a pure Al, the Al can diffuse toward the semiconductor layer 80 made of silicon, thereby causing the malfunction of the semiconductor layer 80. In this regard, it is preferable to form the Al-based metal layer 131 using a material that does not easily diffuse toward the semiconductor layer 80 even though the Al-based metal layer 131 is in contact with the semiconductor layer 80. Therefore, preferably, the Al-based metal layer 131 is made of an Al alloy selected from the group consisting of an aluminum silicon (AlSi) alloy, an aluminum copper (AlCu) alloy, an aluminum neodymium (AlNd) alloy, an aluminum platinum (AlPt) alloy, and an aluminum nickel (AlNi) alloy. Si, Cu, Nd, Pt, and Ni contained in the Al alloys serve to prevent the diffusion of Al of the Al-based metal layer toward the semiconductor layer 80 made of Si. Preferably, the Al-based metal layer 131 contains about 0.5 to 5 wt % of Si, Cu, Nd, Pt, or Ni. According to the results obtained from experiments, the AlSi alloy containing about 2 wt % of Si is more preferable.

The Ti layers 132 and 133 serve to prevent the generation of Al hillocks during a heat treatment process. The diffusion prevention layers 134 and 135 serve to prevent the formation of $TiAl_3$ by reaction of the Al of the Al-based metal layer 131 with the Ti of the Ti layers 132 and 133 during the heat treatment process. By preventing the formation of $TiAl_3$, the resistance of the TFT conductive elements 130 is reduced. Preferably, the diffusion prevention layers 134 and 135 are made of TiN. This is because the TiN efficiently prevents the generation of $TiAl_3$ at an interface between the Al-based metal layer 131 and the Ti layers 132 and 133. Preferably, the TiN layers 134 and 135 contain 5 to 85 wt % of nitrogen.

For reference, the Al-based metal layer 131 and the Ti layers 132 and 133 are deposited by DC-magnetron sputtering under an argon (Ar) gas atmosphere. The TiN layers 134 and 135 are deposited by reactive sputtering under a mixed gas atmosphere of Ar and nitrogen ($N_2$). Such a deposited structure is etched to a predetermined pattern for the TFT conductive elements 130 by dry etching with high frequency-enhanced plasma.

If the thickness of the TiN layers 134 and 135 are too thin, Al diffusion may occur. Therefore, the Al may easily react with the Ti of the Ti layers, thereby producing $TiAl_3$. On the other hand, the TiN layers 134 and 135 are too thick, the resistance of the TFT conductive elements increases due to the high resistivity of the TiN. The TFT conductive elements 130 formed by interposing the TiN layers 134 and 135 between the Al-based metal layer 131 and the Ti layers 132 and 133 must have resistance lower than TFT conductive elements 120 of FIG. 1. The thickness of the TiN layers satisfying these requirements is determined by following experiments and the results are presented in Table 1 below.

Table 1 presents a change in resistivity according to the thickness of the TiN layers in TFT conductive elements having the structure of the Ti layer 132/the TiN layer 134/the Al-based metal layer 131/the TiN layer 135/the Ti layer 133 according to an embodiment of the present invention. For this, each layer of the TFT conductive elements 130 is deposited by sputtering and then is subjected to heat treatment at 380° C. in a vacuum to enhance the interface characteristics of the TFT conductive elements 130.

TABLE 1

| Thickness of Ti layer 132 (Å) | Thickness of TiN layer 134 (Å) | Thickness of Al-based metal layer 131 (Å) | Thickness of TiN layer 135 (Å) | Thickness of Ti layer 133 (Å) | Total thickness (Å) | *Resistivity (μΩcm) |
|---|---|---|---|---|---|---|
| 500 | 0 | 4,000 | 0 | 500 | 5,000 | 17.24 |
| 500 | 100 | 3,800 | 100 | 500 | 5,000 | 5.34 |
| 500 | 200 | 3,600 | 200 | 500 | 5,000 | 4.51 |
| 500 | 300 | 3,400 | 300 | 500 | 5,000 | 4.23 |
| 500 | 400 | 3,200 | 400 | 500 | 5,000 | 4.62 |
| 500 | 500 | 3,000 | 500 | 500 | 5,000 | 5.02 |
| 500 | 600 | 2,800 | 600 | 500 | 5,000 | 5.36 |
| 500 | 700 | 2,600 | 700 | 500 | 5,000 | 5.68 |
| 500 | 800 | 2,400 | 800 | 500 | 5,000 | 6.47 |

TABLE 1-continued

| Thickness of Ti layer 132 (Å) | Thickness of TiN layer 134 (Å) | Thickness of Al-based metal layer 131 (Å) | Thickness of TiN layer 135 (Å) | Thickness of Ti layer 133 (Å) | Total thickness (Å) | *Resistivity (μΩcm) |
|---|---|---|---|---|---|---|
| 500 | 900 | 2,200 | 900 | 500 | 5,000 | 7.03 |
| 500 | 1,000 | 2,000 | 1,000 | 500 | 5,000 | 7.78 |

*Resistivity: resistivity of TFT conductive elements 130

Figure 7:
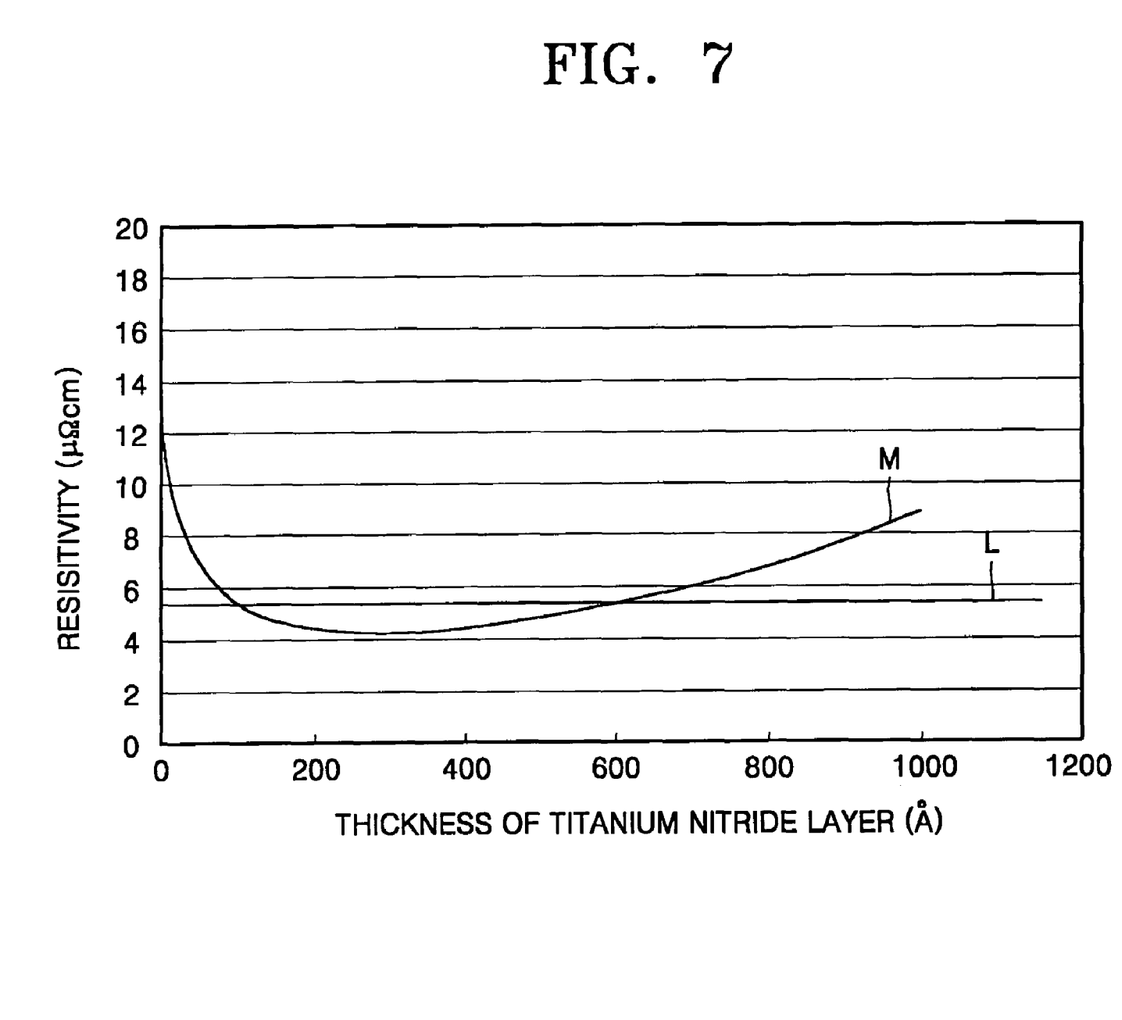
FIG. 7 is a graph illustrating empirical resistivity versus thickness of a titanium nitride layer in the novel TFT conductive element according to the present invention.

The graph of FIG. 7 is obtained from the results of Table 1. In FIG. 7, the line L represents ideal resistivity of TFT conductive elements of a thickness of 5,000 Å made of Mo, i.e., theoretical minimal resistivity that is due to the resistivity of Mo. Using Mo, the ideal resistivity is 5.35 μΩcm. In FIG. 7, a line M represents actual resistivity of TFT conductive elements 130 obtained empirically according to the present invention. That is, the resistivity of the line M is obtained by experiment.

From the graph M of FIG. 7, it can be seen that the thickness of the TiN layers 134 and 135 that result in a conductive element having a better resistivity than Mo based conductive elements satisfying the above-described requirements is a range of 100 to 600 Å. The resistivity of the TFT conductive elements is relatively low when the TiN layers 134 and 135 have a thickness of 200 to 400 Å. In particular, the resistivity of the TFT conductive elements is optimum when the TiN layers have a thickness of about 300 Å. While the TFT conductive elements having the TiN layers 134 and 135 with a thickness of 100 to 200 Å and 400 to 600 Å have resistivity lower than the TFT conductive elements made of only Mo, they have resistivity higher than the TFT conductive elements having the TiN layers 134 and 135 with a thickness of 200 to 400 Å. The TiN layers 134 and 135 with a thickness of 100 to 200 Å can be formed at a low cost, relative to the TiN layers 134 and 135 with a thickness of 400 to 600 Å.

Figure 8:
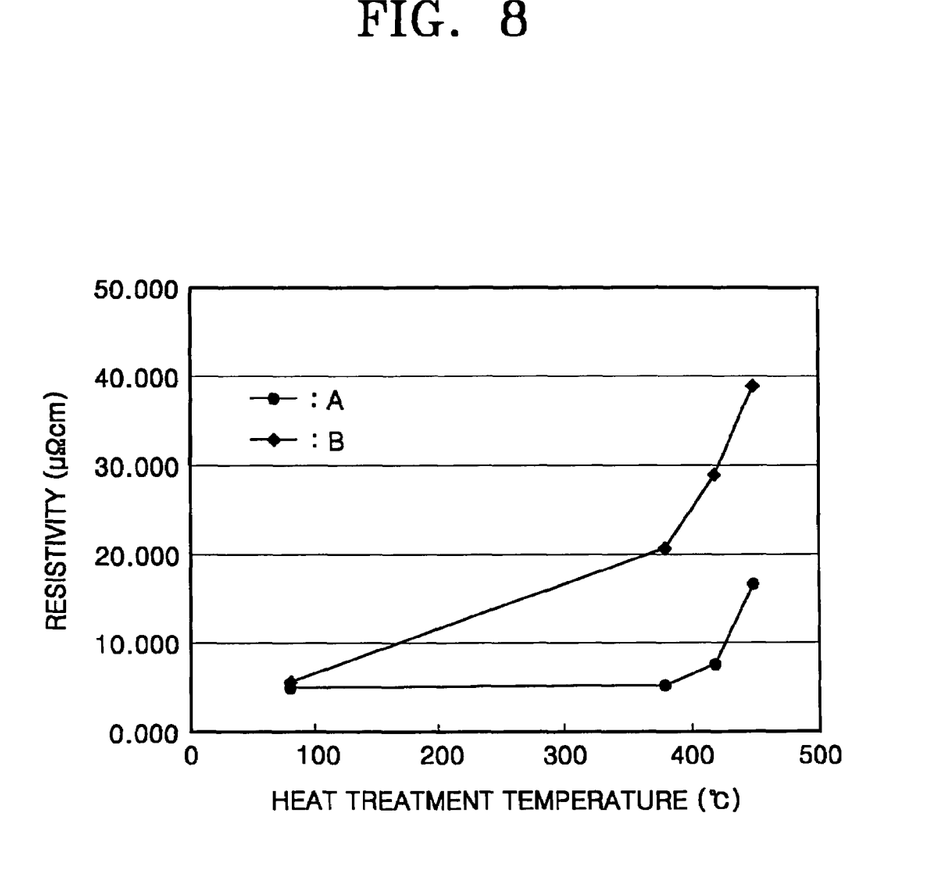
FIG. 8 is a graph illustrating empirically resistivity versus heat treatment temperature in a TFT conductive element and a TFT conductive element according to the principles of the present invention.

FIG. 8 illustrates a resistance reduction effect of TFT conductive elements according to the present invention. In FIG. 8, the horizontal axis represents a temperature for a heat treatment process (heat treatment temperature) and the vertical axis represents resistivity of TFT conductive elements. The graph of A represents the resistivity of TFT conductive elements having a five layer structure of Ti layer (thickness: 500 Å)/TiN layer (thickness: 500 Å)/Al-based metal layer (thickness: 3,000 Å)/TiN layer (thickness: 500 Å)/Ti layer (thickness: 500 Å). The graph of B represents the resistivity of TFT conductive elements having a three layer structure of Ti layer (thickness: 500 Å)/Al-based metal layer (thickness: 4,000 Å)/Ti layer (thickness: 500 Å). As illustrated in FIG. 8, for example, at a heat treatment temperature of 380° C., while the resistivity of the TFT conductive elements with the five layer structure is 5 μΩcm, the resistivity of the TFT conductive elements with the three layer structure is 21.5 μΩcm, that is more than four times higher than the resistivity of the TFT conductive elements with the five layer structure.

In the above case, it is illustrated that TFT conductive elements according to the present invention have the structure of Ti layer 132/TiN layer 134/Al-based metal layer 131/TiN layer 135/Ti layer 133. However, it is understood that TFT conductive elements according to the present invention can have the structure of Ti layer 132/TiN layer 134/Al-based metal layer 131 because a resistance reduction effect is accomplished by the TiN layer interposed between the Al-based metal layer and the Ti layer.

As is apparent from the above description, the present invention provides a TFT in that the generation of TiAl$_3$ is prevented and thus at least one of TFT conductive elements has a sufficiently low resistance, and a flat panel display including the TFT. Therefore, the flat panel display can have a fast response speed of sub-pixels and good image quality. The present invention also provides a TFT in that the generation of aluminum hillocks is prevented even after a heat treatment process, and a flat panel display including the TFT. The present invention also provides a TFT in that Al of TFT conductive elements does not diffuse toward a semiconductor layer, and a flat panel display including the TFT.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display, comprising a plurality of sub-pixels driven by thin film transistors, each of the thin film transistors including a source electrode, a drain electrode, a gate electrode, and a polysilicon semiconductor layer and each of the sub-pixels including a first electrode, a second electrode, and an emitting layer disposed between the first electrode and the second electrode, wherein one of the source electrode and the drain electrode includes:

a first titanium layer contacting the semiconductor layer;
   an aluminum-based metal layer arranged on the first titanium layer;
   a second titanium layer arranged on the aluminum-based metal layer and contacting the first electrode;
   a first titanium nitride layer disposed between the first titanium layer and the aluminum-based metal layer, the first titanium nitride layer preventing titanium from the first titanium layer and aluminum from the aluminum-based metal layer reacting with each other; and
   a second titanium nitride layer disposed between the second titanium layer and the aluminum-based metal layer, the second titanium nitride layer preventing titanium from the second titanium layer and aluminum from the aluminum-based metal layer reacting with each other;
   wherein the titanium nitride layers contain 5 to 85 wt % of nitrogen.

2. The flat panel display of claim 1, wherein the first titanium nitride layer has a thickness of about 100 to 600 Å.

3. The flat panel display of claim 1, wherein the first titanium nitride layer has a thickness of about 100 to 400 Å.

4. The flat panel display of claim 1, wherein the second titanium nitride layer has a thickness of about 200 to 600 Å.

5. The flat panel display of claim 1, wherein the second titanium nitride layer has a thickness of about 300 Å.

6. A flat panel display, comprising a plurality of sub-pixels driven by thin film transistors, each of the thin film transistors including a source electrode, a drain electrode, a gate electrode, and a polysilicon semiconductor layer each of the sub-pixels including a first electrode, a second electrode, and an emitting layer disposed between the first electrode and the second electrode, wherein one of the source electrode and the drain electrode includes:

a first titanium layer contacting the semiconductor layer;

an aluminum-based metal layer arranged on the first titanium layer;

a second titanium layer arranged on the aluminum-based metal layer and contacting the first electrode;

a first titanium nitride layer disposed between the first titanium layer and the aluminum-based metal layer, the first titanium nitride layer preventing titanium from the first titanium layer and aluminum from the aluminum-based metal layer reacting with each other; and a second titanium nitride layer disposed between the second titanium layer and the aluminum-based metal layer, the second titanium nitride layer preventing titanium from the second titanium layer and aluminum from the aluminum-based metal layer reacting with each other;

wherein the aluminum-based metal layer is an aluminum alloy containing about 0.5 to 5 wt % of one element being selected from the group consisting of silicon, copper, neodymium, platinum, and nickel.

7. The flat panel display of claim 6, wherein the aluminum-based metal layer is an aluminum-silicon alloy containing about 2 wt % of silicon.

* * * * *